(12) United States Patent
Lauxtermann

(10) Patent No.: US 7,498,650 B2
(45) Date of Patent: Mar. 3, 2009

(54) BACKSIDE ILLUMINATED CMOS IMAGE SENSOR WITH PINNED PHOTODIODE

(75) Inventor: Stefan C. Lauxtermann, Camarillo, CA (US)

(73) Assignee: Teledyne Licensing, LLC, Camarillo, CA (US)

( * ) Notice: Subject to any disclaimer, the term of this patent is extended or adjusted under 35 U.S.C. 154(b) by 207 days.

(21) Appl. No.: 11/683,772

(22) Filed: Mar. 8, 2007

(65) Prior Publication Data

US 2008/0217723 A1 Sep. 11, 2008

(51) Int. Cl.
*H01L 31/09* (2006.01)
(52) U.S. Cl. ............... 257/460; 257/461; 257/E31.093
(58) Field of Classification Search .................. 257/460, 257/461, E31.093
See application file for complete search history.

(56) References Cited

U.S. PATENT DOCUMENTS

| | | | |
|---|---|---|---|
| 5,303,027 A | 4/1994 | Kuderer et al. | |
| 5,847,594 A | 12/1998 | Mizuno | |
| 6,300,613 B1 | 10/2001 | Kuderer | |
| 6,326,603 B1 | 12/2001 | Kuderer | |
| 6,455,837 B2 | 9/2002 | Mizuno | |
| 6,603,109 B2 | 8/2003 | Pantigny et al. | |
| 6,642,503 B2 | 11/2003 | Kummaraguntla et al. | |
| 6,664,777 B2 | 12/2003 | Hyakutake et al. | |
| 6,678,039 B2 | 1/2004 | Charbon | |
| 6,713,796 B1 * | 3/2004 | Fox ............................ | 257/292 |
| 6,885,047 B2 * | 4/2005 | Shinohara et al. ........... | 257/292 |
| 6,919,549 B2 | 7/2005 | Bamji et al. | |
| 6,977,601 B1 | 12/2005 | Fletcher et al. | |
| 6,977,682 B2 | 12/2005 | Mizuno et al. | |
| 7,115,925 B2 | 10/2006 | Rhodes | |
| 7,138,287 B2 | 11/2006 | Mouli et al. | |
| 7,157,685 B2 | 1/2007 | Bamji et al. | |
| 7,202,463 B1 | 4/2007 | Cox | |
| 7,244,919 B2 | 7/2007 | Ishikawa et al. | |
| 7,326,903 B2 | 2/2008 | Ackland | |
| 7,453,131 B2 * | 11/2008 | Marshall et al. ............. | 257/438 |
| 2005/0167709 A1 * | 8/2005 | Augusto ..................... | 257/292 |
| 2007/0194356 A1 * | 8/2007 | Moon et al. ................. | 257/291 |

OTHER PUBLICATIONS

Janesick, J. et al. "CMOS minimal array." *Infrared Detectors and Focal Plane Arrays VIII. Proceedings of the SPIE*. vol. 6295. (2006): 62950O, 15 pages.

Pain, B. "Fabrication and initial results for a back-illuminated monolithic APS in a mixed SOI/bulk CMOS technology." *As presented at the Jun. 2005 IEEE Workshop on Charge-Coupled Devices and Advanced Image Sensors*, p. 102-104.

(Continued)

*Primary Examiner*—Trung Dang
(74) *Attorney, Agent, or Firm*—Snell & Wilmer L.L.P.

(57) ABSTRACT

A backside illuminated CMOS image sensor having an silicon layer with a front side and a backside, the silicon layer liberates charge when illuminated from the backside with light, an active pixel circuitry located on the front side of the semiconductor layer, a pinned photodiode adjacent to the active pixel circuitry on the front side of the semiconductor layer and configured to collect charge liberated in the semiconductor layer, and an implant located in the semiconductor layer, underneath the active pixel circuitry, for allowing charge liberated in the semiconductor layer to drift from the backside of the semiconductor layer to the pinned photodiode on the front side of the semiconductor layer.

20 Claims, 6 Drawing Sheets

OTHER PUBLICATIONS

A. Chandrakasan, et al., "Design of High-Performance Microprocessor Circuits", IEEE Press, 2001, pp. 285-308.

Jae-Joon Kim, et al., "Back-Gate Controlled Read SRAM with Improved Stability", IEEE International SOI Conference, 2005, pp. 211-212.

Christ H. Kim, et al., "PVT-Aware Leakage Reduction for On-Die Caches with Improved Read Stability", IEEE International Solid-State Circuits Conference, 2005, pp. 13-15.

Oliver Thomas, "An SOI 4 Transistors Self-Refresh Ultra-Low-Voltage memory cell", ISCAS, May 2003, pp. V-401-V-404.

* cited by examiner

BACKSIDE ILLUMINATED CMOS IMAGE SENSOR WITH PINNED PHOTODIODE

BACKGROUND OF THE INVENTION

1. Field of the Invention

The invention relates generally to CMOS image sensors. More particularly, the invention relates to backside illuminated CMOS image sensors with pinned photodiodes.

2. Description of Related Art

Charge-coupled device (CCD) and complementary metal-oxide-semiconductor (CMOS) image sensors are two different technologies used for capturing images digitally. Both types of imagers convert light into electric charge. A CCD sensor has charges transferred from every pixel to a limited number of output nodes for conversion to voltage, while CMOS sensors have charge-to-voltage conversion for each pixel.

Conventional front side illuminated CMOS image sensors suffer from a number of drawbacks. For example, reduced photo-response, obscurations from metal lines crisscrossing pixel area, reduced fill factor, low short and long wavelength quantum efficiency (QE) for blue photons and near-infrared (NIR) wavelengths, respectively, and interference fringing from thin passivation and interlayer dielectrics.

Backside illuminated CCDs have active pixel circuitry, such as electrodes and gates, arranged on the front surface of each substrate wafer. The backside is illuminated to circumvent preferential absorption of blue photons that typically result from front side illumination and to increase the absorption of NIR photons.

Conventional backside illuminated CCDs also have a number of drawbacks. For example, backside illuminated CCDs lack single chip system capabilities. Conventional backside illuminated CCDs are also not suited for high frame rate low noise imagers.

Using CMOS backside illumination, the image sensor operates with no metal line related effects and with up to 100% fill-factor. Backside illuminated CMOS image sensors provide high quality QE, excellent angular response and availability of additional space in the pixel for integration of in-pixel signal processing circuits. Despite these enumerated advantages, the backside illuminated CMOS image sensors suffer from a number of drawbacks. Backside illuminated CMOS image sensors with conventional photodiodes have high noise, high dark current and high sense node capacitance.

With an ever increasing demand for improved image sensors, there remains a need in the art for backside illuminated CMOS image sensors with reduced noise, dark current and sense node capacitance.

SUMMARY OF THE INVENTION

The present invention fills this need by providing a backside illuminated CMOS image sensor having an semiconductor layer with a front side and a backside, the semiconductor layer liberates charge when illuminated from the backside with light, an active pixel circuitry located on the front side of the semiconductor layer, a pinned photodiode adjacent to the active pixel circuitry on the front side of the semiconductor layer and configured to collect charge liberated in the semiconductor layer, an implant located in the semiconductor layer, underneath the active pixel circuitry, for allowing charge liberated in the semiconductor layer to drift from the backside of the semiconductor layer to the pinned photo diode on the front side of the semiconductor layer, and an oxide layer on the backside of the semiconductor layer.

According to an embodiment of the invention, the backside illuminated CMOS image sensor includes a backside electrode between the oxide layer and the semiconductor layer, the backside electrode is configured to reverse bias the backside illuminated CMOS image sensor. The backside illuminated CMOS image sensor may also include a triple well located in the semiconductor layer, between the active pixel circuitry and the implant, to maintain a constant threshold voltage in the active pixel circuitry, independent of an applied backside bias.

BRIEF DESCRIPTION OF THE DRAWINGS

The exact nature of this invention, as well as the objects and advantages thereof, will become readily apparent from consideration of the following specification in conjunction with the accompanying drawings in which like reference numerals designate like parts throughout the figures thereof and wherein.

DETAILED DESCRIPTION OF THE PREFERRED EMBODIMENTS

Photodiodes are widely used in digital imaging devices to convert optical signals into electrical signals. Photodiodes may be arranged in linear or planar arrays with a plurality of photosensitive sensors, generally designated as pixels, on a semiconductor chip. Each pixel generates an output signal representing the amount of light incident on the pixel.

Figure 1:
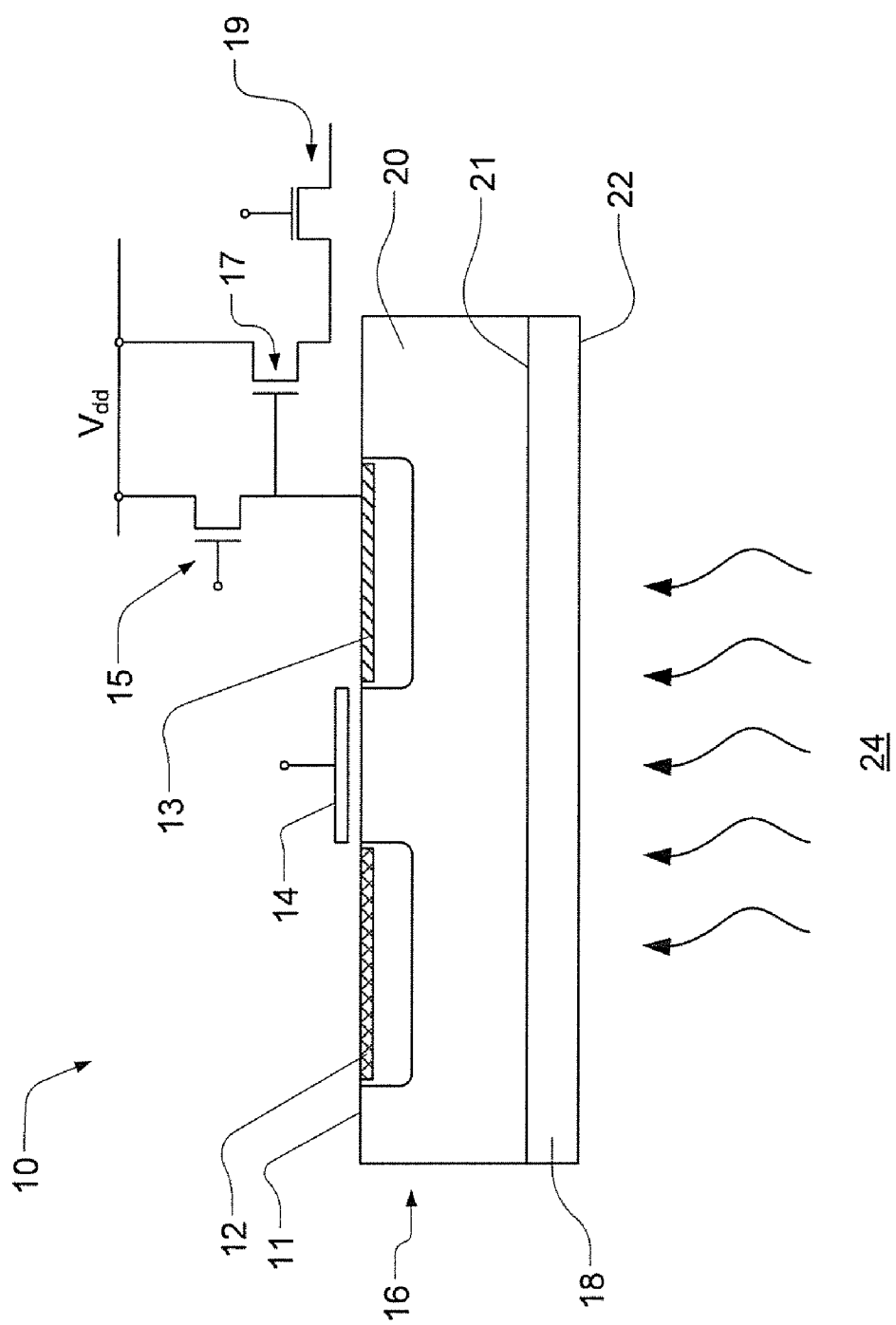
FIG. 1 is a backside illuminated CMOS image sensor with a pinned photodiode, according to an embodiment of the invention.

A pinned photodiode (PPD) may be used to produce and integrate photoelectric charges generated in CMOS image sensors. FIG. 1 is a backside illuminated CMOS image sensor 10, according to an embodiment of the invention. The backside illuminated CMOS image sensor 10 integrates, for example, a four transistor (4T) architecture pixel with an oxide layer 18. The 4T architecture pixel, fabricated on a front side 11 of a semiconductor layer 16, includes a pinned photodiode 12, a floating diffusion 13, a transfer gate 14, a reset transistor 15, a source follower transistor 17 and a row select transistor 19.

The pinned photodiode 12 may collect charge due to light 24 incident on the pixel and output a signal to the source follower transistor 17. The transfer gate 14 may transfer the signal from the pinned photodiode 12 to the floating diffusion 13. The floating diffusion region 13 may be electrically coupled to the gate of the output source follower transistor 17. The row select transistor 19 may output the signal from the source follower transistor 17 to an output readout terminal in response to an address signal. After readout, the reset transistor 15 may reset the floating diffusion 13 to a reference voltage, ($V_{dd}$-$V_{th}$), where $V_{th}$ is the threshold voltage of reset transistor 15.

The pinned photodiode 12 may be fabricated on semiconductor layer 16. The semiconductor layer 16 may be an epitaxial layer with a p-doped region 20. For example, the p-doped region 20 may be 5 μm thick and contain $2 \times 10^{14}/cm^3$ boron doping.

The oxide layer 18 may be made of silicon dioxide with a front side 21 and a back side 22. The oxide layer 18 serves as an etch stop during the fabrication of CMOS image sensor 10. The back side 22 of the oxide layer 18 is generally uniformly planar. The interface between the front side 21 of the oxide layer 18 and the semiconductor layer 16 has a very low interface trap density, eliminating the need for annealing of the backside surface 22. Light 24 travels across the oxide layer 18 and gets absorbed by the light receiving element of the pinned photodiode 12. The oxide layer 18, in combination with the pinned photodiode 12, reduces noise, dark current and sense node capacitance in the backside illuminated CMOS sensor 10.

According to an embodiment of the invention, the CMOS image sensor 10 is fabricated using a wafer-level thinning process. The starting SOI wafer for the CMOS image sensor 10 includes a buried oxide layer 18 between a silicon wafer and the semiconductor layer 16. The semiconductor layer 16 includes at least one pinned photodiode 12.

Prior to thinning, the starting SOI wafer may be coupled to a handling wafer, such as a glass wafer, for mechanical support. The silicon wafer may be thinned using a grinding or turning diamond and then removed using, for example, a wet etching or a reactive ion etching (RIE) process. The buried oxide layer 18 provides a natural etch stop for the etching process. This fabrication process exposes the buried oxide layer 18 and develops a generally uniform planar back surface 22.

According to an embodiment of the invention, the thinning process may be applied for the entire starting SOI wafer or only underneath an active array of pinned photodiodes 12 using backside lithography. The use of a handling wafer may not be necessary if the thinning process is applied only underneath the array of pinned photodiodes 12.

Figure 2:
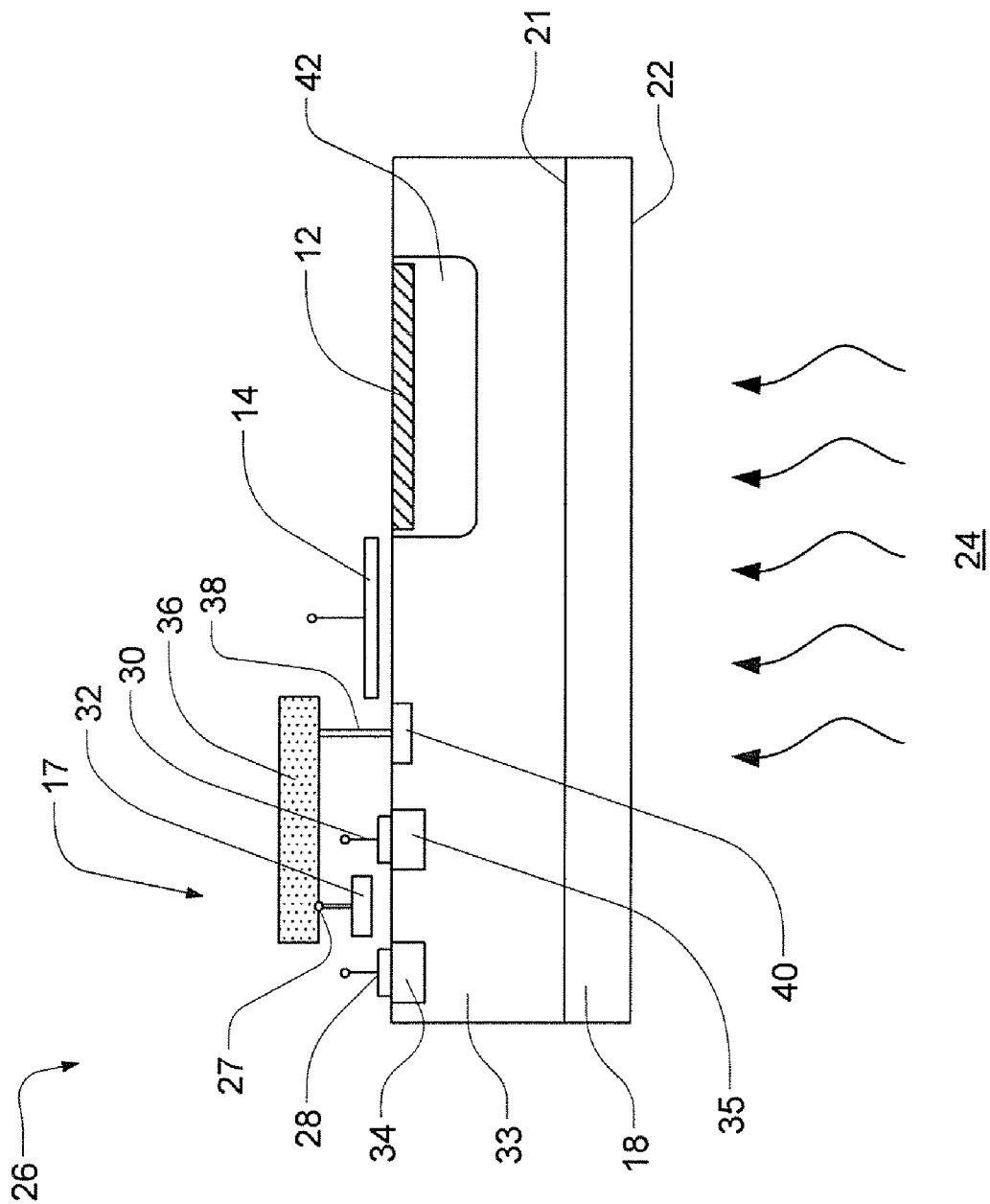
FIG. 2 is a backside illuminated CMOS image sensor with a pinned photodiode and an oxide layer, according to an embodiment of the invention.

FIG. 2 is a backside illuminated CMOS image sensor 26 with pinned photodiode 12 and oxide layer 18, according to an embodiment of the invention. The CMOS image sensor 26 may include active pixel circuitry, such as an n-type metal-oxide-semiconductor (NMOS) device. Source follower transistor 17 may be an NMOS device with a sense node 27 and a gate 32 connected to an n-doped region 40 via metal connection 36 and contact 38. The gate 32 is the gate terminal of the source follower transistor 17 with source 28 and drain 30. The source 28 and the drain 30 are connected to n-doped regions 34 and 35 in a p-doped semiconductor layer 33. Contact 38 is connected to an n-doped region 40 in the p-doped semiconductor layer 33.

The oxide layer 18 may be made of silicon dioxide with front side 21 and back side 22. The oxide layer 18 serves as an etch stop during the fabrication of CMOS image sensor 26. The back side 22 of the oxide layer 18 is generally uniformly planar. The interface between the front side 21 of the oxide layer 18 and the semiconductor layer 33 has very low interface trap density, eliminating the need for annealing of the backside surface 22. Light 24 travels across oxide layer 18 and gets absorbed within semiconductor layer 33, generating a charge that is collected by pinned photodiode 12.

The pinned photodiode 12 is connected to the semiconductor layer 33 via n-doped region 42. The pinned photodiode 12 collects charge generated by light 24 incident on the pixel and outputs a signal to the source follower transistor 17. The transfer gate 14 may transfer the signal from the pinned photodiode 12 to the sense node 27 of source follower transistor 17. This allows the CMOS image sensor 26 to operate using backside illumination. The NMOS source follower transistor 17, in combination with the pinned photodiode 12, the transfer gate 14, the oxide layer 18 and a correlated double sampling (CDS) readout circuit (not shown), reduces noise, dark current and sense node capacitance in the backside illuminated CMOS image sensor 26. A camera using this sensor 26 is therefore particularly suited for low light level imaging.

Figure 3:
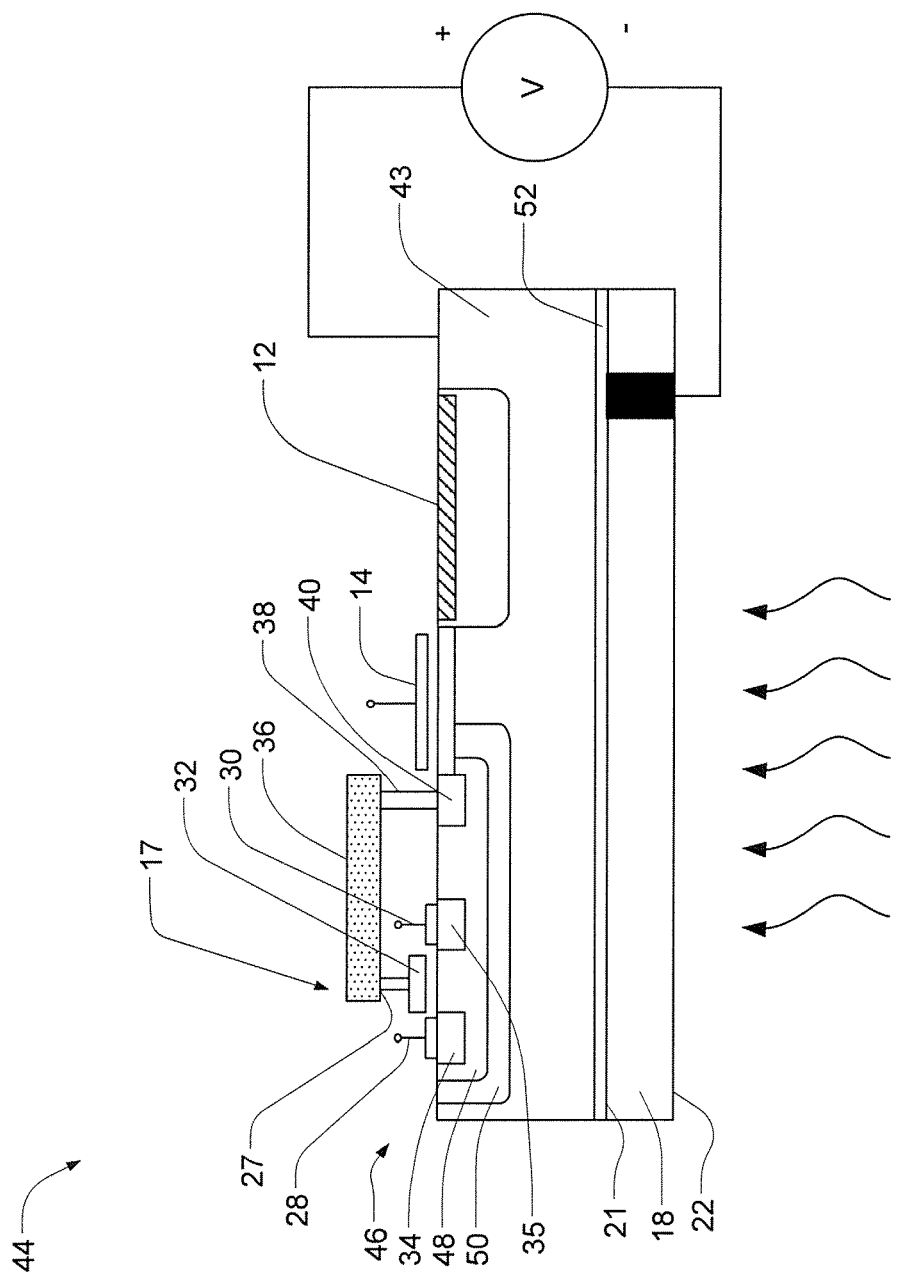
FIG. 3 is a backside illuminated CMOS image sensor with a pinned photodiode, an oxide layer 18 and a backside electrode, according to an embodiment of the invention.

FIG. 3 is a backside illuminated CMOS image sensor 44 with pinned photodiode 12, oxide layer 18 and backside electrode 52, according to an embodiment of the invention. The CMOS image sensor 44 may include active pixel circuitry, such as source follower transistor 17. The pinned photodiode 12 collects charge generated by light 24, incident on the pixel and outputs a signal to a source follower 17. Underneath the pinned photodiode 12 is n-doped region 42 of semiconductor layer 43. Transfer gate 14 transfers the signal from the pinned photodiode 12 to the sense node 27 of source follower transistor 17.

Source follower transistor 17 may include a sense node 27 and a gate 32 connected to an n-doped region 40 via metal connection 36 and contact 38. The gate 32 is the gate terminal of the source follower transistor 17 with source 28 and drain 30. The source 28 and the drain 30 are connected to n-doped regions 34 and 35. Underneath the source follower transistor 17 is a triple well configuration 46 that includes the n-doped regions 34, 35 and 40, isolated in a p-well 48, which is further contained in an n-well 50. Since the source follower transistor 17 may not be operable due to a backside bias applied through the backside electrode 52, the triple well configuration 46 may be employed to maintain a constant threshold voltage of the NMOS active pixel circuitry, independent of an applied backside bias.

The backside electrode 52 may be positioned between the front side 21 of the oxide layer 18 and the semiconductor layer 43. For example, the backside electrode 52 may be deposited on oxide layer 18 prior to the deposition of semiconductor layer 43. The backside electrode 52 may be used to reverse bias the CMOS sensor 44. Reverse biasing enhances the performance of the CMOS sensor 44 by improving quantum efficiency and reducing cross talk. The backside electrode 52 may be a shallow high concentration implant or a transparent electrode, such as an indium tin oxide (ITO) electrode. Light 24 travels across oxide layer 18 and gets absorbed within semiconductor layer 43, generating a charge that is collected by pinned photodiode 12. The backside electrode 52, in combination with the pinned photodiode 12, the oxide layer 18 and a correlated double sampling (CDS) readout circuit (not shown), reduces noise, dark current and sense node capacitance in the backside illuminated CMOS image sensor 44. A camera using this sensor 44 is therefore particularly suited for low light level imaging.

Since charges, generated due to backside illumination, diffuse towards the pinned photodiode 12 and the active pixel circuitry, some of the charges will be lost to the active pixel circuitry. The pinned photodiode 12 collects only a fraction of the charges diffusing through the semiconductor layer 43 and outputs a signal to the source follower transistor. The efficiency of the CMOS image sensor 44 would greatly improve if more charge traveled to the pinned photodiode 12 instead of the active pixel circuitry.

Figure 4:
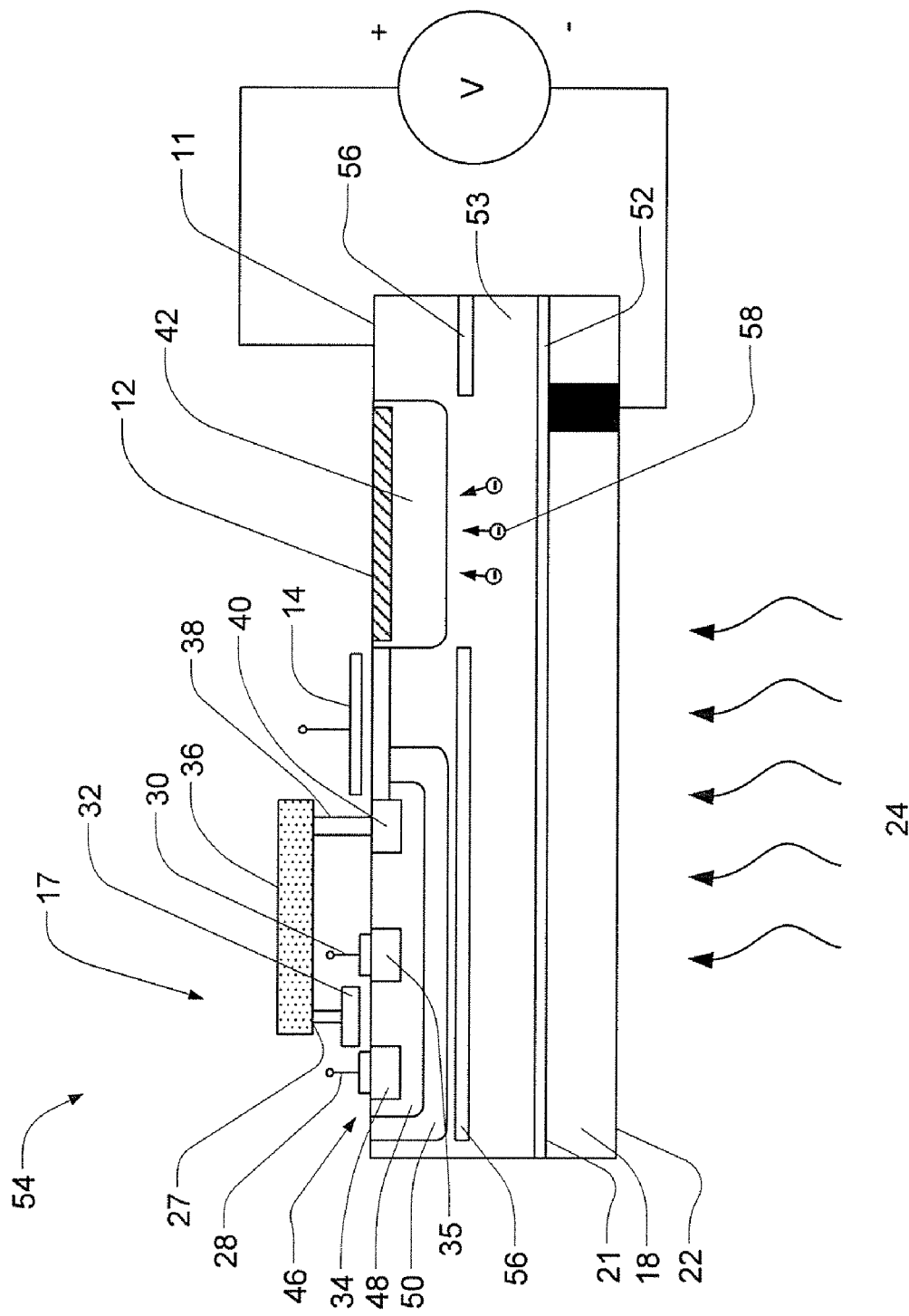
FIG. 4 is a backside illuminated CMOS image sensor with a p-layer, according to an embodiment of the invention.

According to an embodiment of the invention, a p-layer may be used to drift the charges to the charge collecting element of the pinned photodiode 12. FIG. 4 illustrates a backside illuminated CMOS image sensor 54 with a p-layer 56. The CMOS image sensor 54 may include pinned photodiode 12, source follower transistor 17, and backside electrode 52. The pinned photodiode 12 collects charge due to light 24 incident on the pixel and outputs a signal to the source follower transistor 17. Underneath the pinned photodiode 12 is n-doped region 42 of a high resistivity semiconductor layer 53. Transfer gate 14 transfers the signal from the pinned photodiode 12 to the NMOS source follower device 17.

Source follower transistor 17 may be an NMOS device with a sense node 27 and a gate 32 connected to an n-doped region 40 via metal connection 36 and contact 38. The gate 32 is the gate terminal of the source follower transistor 17 with source 28 and drain 30. The source 28 and the drain 30 are connected to n-doped regions 34 and 35. Underneath the source follower transistor 17 is the triple well configuration 46 with n-doped regions 34, 35 and 40, isolated in a p-well 48, which is further contained in an n-well 50. Since the source follower transistor 17 may not be operable due to a backside bias applied through the backside electrode 52, the triple well configuration 46 may be employed to maintain a constant threshold voltage of the NMOS active pixel circuitry, independent of an applied backside bias, and all other NMOS devices that may be on the front side of the CMOS image sensor 54.

The backside electrode 52 may be positioned between the front side 21 of the oxide layer 18 and the semiconductor layer 53. For example, the backside electrode 52 may be deposited on oxide layer 18 prior to the deposition of semiconductor layer 53. The backside electrode 52 may be used to reverse bias the CMOS sensor 44. Reverse biasing enhances the performance of the CMOS sensor 44, improves quantum efficiency and reduces cross talk. The backside electrode 52 may be a shallow high concentration implant or a transparent electrode, such as an indium tin oxide (ITO) electrode. Light 24 travels across the oxide layer 18 and backside electrode 52, and gets absorbed by the light receiving element of the pinned photodiode 12.

The p-layer 56 may be used to further reduce cross talk and recombination in the CMOS sensor 44. The p-layer 56 may be a deep p+ implant located underneath the circuitry 17. According to an embodiment of the invention, the p-layer 56 allows charge 58 to drift, rather than diffuse, to the light receiving element of the pinned photodiode 12. This improves the efficiency of the CMOS image sensor 44 by allowing the pinned photodiode 12 to collect more charges 58 liberated in the semiconductor layer 53 due to backside illumination.

Figure 5:
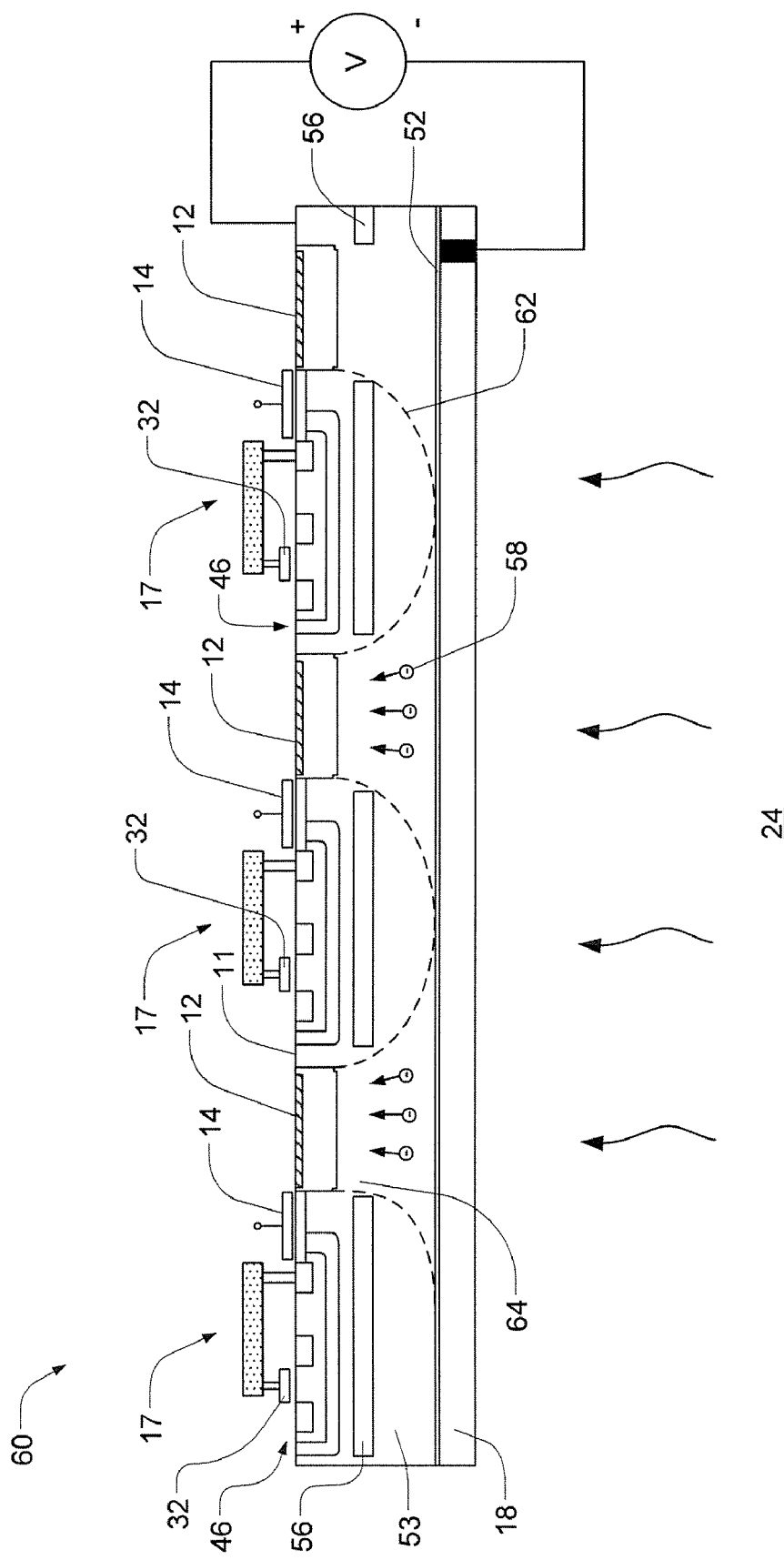
FIG. 5 illustrates backside illuminated CMOS image sensors with a plurality of p-layers, according to an embodiment of the invention.

FIG. 5 illustrates backside illuminated CMOS image sensors 60 with a plurality of p-layers 56, according to an embodiment of the invention. Electrical field lines 62 form around the p-layers 56 and create electron funnels 64 that direct charge 58 to drift towards the pinned photodiode 12. Since there is no active pixel circuitry on the backside of the CMOS image sensors 60, light of different wavelength, for example, blue photons and red photons, liberate charges 58 on the backside of the semiconductor layer 53 that are directed thereafter towards the pinned photodiode 12. Consequently, the pinned photodiode 12 collects more charges 58 generated from blue and red photons. The p-layers 56, in combination with high resistivity semiconductor layer 53, backside contact 52 and oxide layer 18, enhances the performance of the CMOS sensor 60, improves quantum efficiency and reduces noise, dark current and sense node capacitance.

Figure 6:
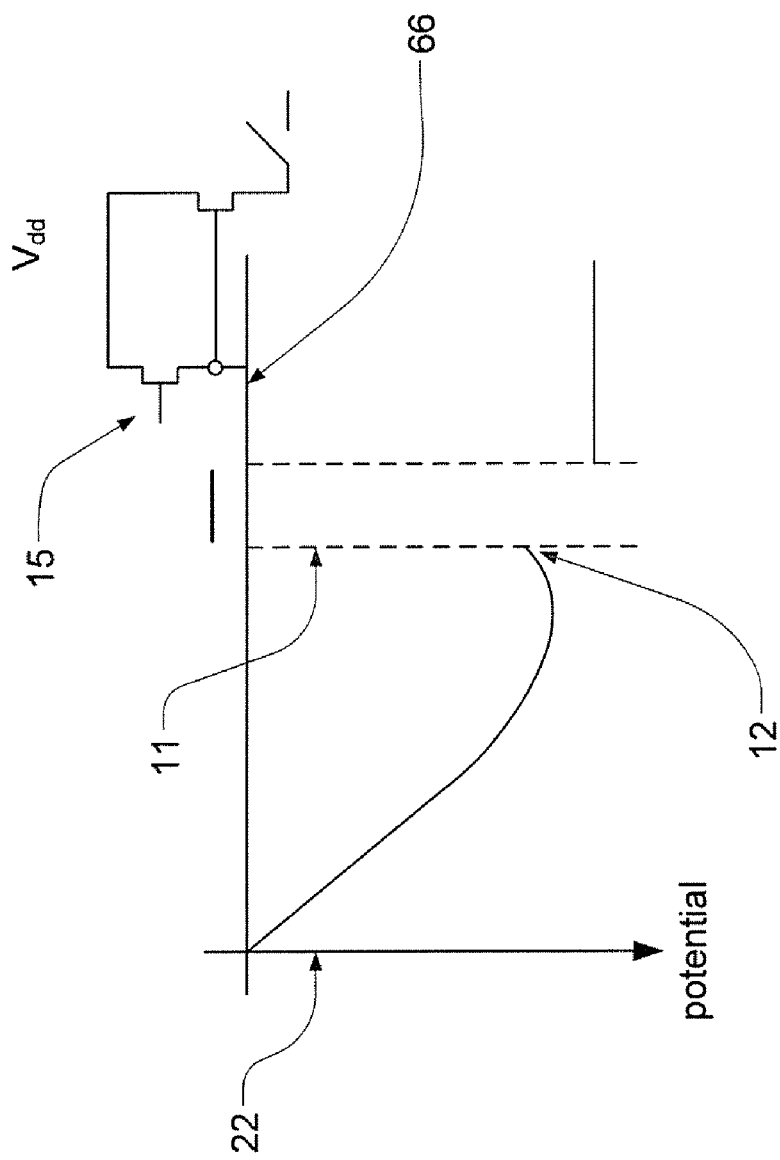
FIG. 6 illustrates the potential distribution underneath the backside illuminated CMOS image sensor of FIG. 5.

FIG. 6 illustrates the potential distribution underneath pinned photodiode 12 of CMOS image sensor 60, according to an embodiment of the invention. With a negative voltage applied on the backside relative to the front-side of the CMOS image sensor 60, via backside electrode 52, electrical field lines 62 form around the p-layers 56 and direct charges 58 to drift towards the light receiving element of the pinned photodiode 12. These charges 58 may then be transferred from the pinned photodiode 12 to the sense node 66.

While certain exemplary embodiments have been described and shown in the accompanying drawings, it is to be understood that such embodiments are merely illustrative of and not restrictive on the broad invention, and that this invention not be limited to the specific constructions and arrangements shown and described, since various other changes, combinations, omissions, modifications and substitutions, in addition to those set forth in the above paragraphs, are possible.

For example, the CMOS image sensor may include active pixel circuitry, such as a p-type metal-oxide-semiconductor (PMOS) device. Furthermore, any type of implant, such as a deep n+ implant, may be positioned underneath the circuitry to allow charge to drift to the light receiving element of the pinned photodiode.

Those skilled in the art will appreciate that various adaptations and modifications of the just described preferred embodiment can be configured without departing from the scope and spirit of the invention. Therefore, it is to be understood that, within the scope of the appended claims, the invention may be practiced other than as specifically described herein.

What is claimed is:

1. A backside illuminated CMOS image sensor, comprising:
    a semiconductor layer having a front side and a backside, the semiconductor layer liberates charge when illuminated from the backside with light;
    an active pixel circuitry located on the front side of the semiconductor layer;
    a photodiode adjacent to the active pixel circuitry on the front side of the semiconductor layer and configured to collect charge liberated in the semiconductor layer; and
    an implant located in the semiconductor layer, underneath the active pixel circuitry, for allowing charge liberated in the semiconductor layer to drift from the backside of the semiconductor layer to the photodiode on the front side of the semiconductor layer.

2. The backside illuminated CMOS image sensor of claim 1 wherein the photodiode is a pinned photodiode.

3. The backside illuminated CMOS image sensor of claim 1 wherein the implant is a deep p+ implant.

4. The backside illuminated CMOS image sensor of claim 1 wherein the active pixel circuitry is an NMOS source follower transistor.

5. The backside illuminated CMOS image sensor of claim 1 further comprising an oxide layer on the backside of the semiconductor layer.

6. The backside illuminated CMOS image sensor of claim 5 further comprising a backside electrode between the oxide layer and the semiconductor layer, the backside electrode is configured to reverse bias the backside illuminated CMOS image sensor.

7. The backside illuminated CMOS image sensor of claim 1 further comprising:
    an electrode on the backside of the semiconductor layer, the electrode is configured to reverse bias the backside illuminated CMOS image sensor;
    an oxide layer covering the electrode; and a triple well located in the semiconductor layer, between the active pixel circuitry and the implant, for maintaining a constant threshold voltage in the active pixel circuitry, independent of an applied backside bias.

8. A backside illuminated CMOS image sensor, comprising:
   a semiconductor layer having a front side and a backside, the semiconductor layer liberates charge when illuminated from the backside with light;
   an active pixel circuitry located on the front side of the semiconductor layer;
   a pinned photodiode adjacent to the active pixel circuitry on the front side of the semiconductor layer and configured to collect charge liberated in the semiconductor layer; and
   an implant located in the semiconductor layer, underneath the active pixel circuitry, for allowing charge liberated in the semiconductor layer to drift from the backside of the semiconductor layer to the pinned photodiode on the front side of the semiconductor layer.

9. The backside illuminated CMOS image sensor of claim 8 wherein the implant is a deep p+ implant.

10. The backside illuminated CMOS image sensor of claim 8 wherein the active pixel circuitry is an NMOS device.

11. The backside illuminated CMOS image sensor of claim 8 further comprising an oxide layer on the backside of the semiconductor layer.

12. The backside illuminated CMOS image sensor of claim 11 further comprising a backside electrode between the oxide layer and the semiconductor layer, the backside electrode is configured to reverse bias the backside illuminated CMOS image sensor.

13. The backside illuminated CMOS image sensor of claim 8 further comprising:
   an electrode on the backside of the semiconductor layer, the electrode is configured to reverse bias the backside illuminated CMOS image sensor;
   an oxide layer covering the electrode; and
   a triple well located in the semiconductor layer, between the active pixel circuitry and the implant, for maintaining a threshold voltage in the active pixel circuitry.

14. A backside illuminated CMOS image sensor, comprising:
   a semiconductor layer having a front side and a backside, the semiconductor layer releases charge when illuminated from the backside with light;
   an active pixel circuitry located on the front side of the semiconductor layer;
   a pinned photodiode adjacent to the active pixel circuitry on the front side of the semiconductor layer and configured to collect charge released in the semiconductor layer;
   an implant located in the semiconductor layer, underneath the active pixel circuitry, for allowing charge released in the semiconductor layer to drift from the backside of the semiconductor layer to the pinned photodiode on the front side of the semiconductor layer; and
   an oxide layer on the backside of the semiconductor layer.

15. The backside illuminated CMOS image sensor of claim 14 wherein the implant is a deep p+ implant.

16. The backside illuminated CMOS image sensor of claim 14 wherein the active pixel circuitry is a source follower transistor.

17. The backside illuminated CMOS image sensor of claim 14 further comprising a backside electrode between the oxide layer and the semiconductor layer, the backside electrode is configured to reverse bias the backside illuminated CMOS image sensor.

18. The backside illuminated CMOS image sensor of claim 17 further comprising a triple well located in the semiconductor layer, between the active pixel circuitry and the implant, for maintaining a constant threshold voltage in the active pixel circuitry.

19. The backside illuminated CMOS image sensor of claim 17 wherein the backside electrode is a shallow high concentration implant.

20. The backside illuminated CMOS image sensor of claim 17 wherein the backside electrode is an indium tin oxide electrode.

* * * * *